United States Patent [19]

Chiba

[11] Patent Number: 4,979,290
[45] Date of Patent: Dec. 25, 1990

[54] METHOD FOR SOLDERING ELECTRONIC COMPONENT

[75] Inventor: Koichi Chiba, Yokohama, Japan

[73] Assignee: Kabushiki Kaisha Toshiba, Kanagawa, Japan

[21] Appl. No.: 236,979

[22] PCT Filed: Dec. 28, 1987

[86] PCT No.: PCT/JP87/01049
§ 371 Date: Aug. 26, 1988
§ 102(e) Date: Aug. 26, 1988

[87] PCT Pub. No.: WO88/05250
PCT Pub. Date: Jul. 14, 1988

[30] Foreign Application Priority Data

Dec. 29, 1986 [JP] Japan .................. 61-311947

[51] Int. Cl.⁵ .................................. H05K 3/34
[52] U.S. Cl. .................................. 29/840; 29/833; 219/121.63; 228/49.1; 228/180.2
[58] Field of Search ........... 29/833, 834, 840, 407, 29/720, 721, 741; 228/49.1, 180.2; 219/121.63

[56] References Cited

U.S. PATENT DOCUMENTS

| | | | |
|---|---|---|---|
| 3,497,947 | 3/1970 | Ardezzone | 228/49.1 X |
| 3,534,462 | 10/1970 | Cruickshank et al. | 228/180.2 |
| 3,586,813 | 6/1971 | Cruickshank et al. | 228/180.2 X |
| 3,632,955 | 1/1972 | Cruickshank et al. | 228/180.2 X |
| 4,163,309 | 8/1979 | Stückler | 29/720 X |
| 4,222,036 | 9/1980 | Troukens | 29/833 X |
| 4,278,867 | 7/1981 | Tan | 219/121.63 X |
| 4,404,741 | 9/1983 | Lebet et al. | 29/833 X |
| 4,696,104 | 9/1987 | Vanzetti et al. | 29/840 |
| 4,720,617 | 1/1988 | Hayakawa et al. | 219/121.63 X |
| 4,731,923 | 3/1988 | Yagi et al. | 29/834 X |
| 4,785,156 | 11/1988 | Benko et al. | 219/121.63 X |
| 4,792,658 | 12/1988 | Langhans et al. | 219/121.63 |

FOREIGN PATENT DOCUMENTS

| | | | |
|---|---|---|---|
| 2751651 | 5/1979 | Fed. Rep. of Germany | 29/833 |
| 2441320 | 7/1980 | France | 29/721 |

Primary Examiner—Carl E. Hall
Assistant Examiner—Carl J. Arbes
Attorney, Agent, or Firm—Finnegan, Henderson, Farabow, Garrett and Dunner

[57] ABSTRACT

A soldering method wherein a high-energy beam such as a laser beam is projected onto different lead terminal arrays of electronic components, the beam being projected in a scanning manner a plurality of times two-dimensionally and continuously is described. The invention further relates to a soldering apparatus comprising a mechanism for holding an electronic component by the tip thereof, a rotary drive mechanism (27) which turns the electronic component holding mechanism so that the position of the electronic component in the rotational direction is brought into agreement with a practical mounting position on the circuit board, holding unit-drive mechanisms (21, 22, 25) that move the electronic component-holding mechanism three-dimensionally, beam radiation mechanisms (41, 42) for irradiating the surface of the circuit board with high energy, beam radiation angle change mechanisms (53, 54) for changing the radiation angle of the high-energy beam emitted from the beam radiation mechanisms relative to the circuit board, and a beam scanning controller (47) which controls the beam radiation angle change mechanisms such that the high-energy beam scans a predetermined lead terminal array of the electronic components mounted on the circuit board a predetermined number of times. Using this apparatus, the soldering is effected under conditions where the temperature rise near the lead terminals and the temperature distribution are made uniform.

3 Claims, 4 Drawing Sheets

METHOD FOR SOLDERING ELECTRONIC COMPONENT

TECHNICAL FIELD

The present invention relates to a method and an apparatus for soldering an electronic component of a semiconductor device, e.g., a flat package IC to a printed circuit board.

BACKGROUND ART

Conventionally, an automatic soldering apparatus has been used for mounting and soldering an electronic component 1 having lead arrays 3 extending substantially horizontally from the respective sides of its main body portion 2 on a predetermined position on a circuit board (not shown).

One example of such soldering process presses a heater chip against the lead terminal arrays 3 of the electronic component 1 and thereafter heats the heater chip, thereby performing soldering. However, since such a soldering process uses a physical contact, various problems, e.g., a positional error of the electronic component upon contact with the heater chip occur. In order to solve these problems, a soldering apparatus has recently been developed wherein a soldering method using a non-contact process such as a laser beam is employed.

One of the soldering apparatuses using such a non-contact process has a bench for placing a circuit board on which an electronic component 1 is temporarily fixed, a laser emitting section arranged to oppose the circuit board on the bench, and a laser moving means such as an X-Y table on which the laser emitting means is mounted thereon for moving the laser emitting means in the X-Y direction on the circuit board.

In the soldering process of such soldering apparatus, the laser moving means is driven to move the laser emitting means in the X-Y direction, so that a laser beam A sequentially radiates the lead terminal arrays 3.

There is another process for soldering in which the laser beam is used as a linear spot, and simultaneously radiates the terminals of a lead terminal array 3 on one side of an electronic component.

However, in the conventional soldering process described above, when one lead terminal is soldered the laser beam is to be moved to the next lead terminal for serially soldering the terminals, or when one terminal array is simultaneously soldered by using the linear type beam spot, another terminal array should be soldered continuously. Therefore, one lead terminal can be thermally influenced by an adjacent lead terminal to cause undesirable results. For example, adjacent lead terminals are connected through solder and are electrically connected each other, thereby resulting in a solder bridge.

In addition, local temperature rise in the vicinity of the laser radiated portion enhances the above problem. This problem tends to easily occur particularly in a narrow pitch flat package IC in which the lead pitch is for example 0.5 mm or 0.65 mm. A technique for solving this problem has been desired.

Further, since all the lead terminal arrays are soldered with a single laser beam, reduction in the soldering time is limited due to the scanning performance of the laser beam.

The present invention has been made in order to solve the drawbacks of conventional soldering process.

Since the present invention uses a high energy beam such as a laser beam and radiates two-dimentionally and continuously each lead terminal array in a plurality of times, the temperature rise rate and the temperature distribution in the vicinity of the lead terminals can be uniformed. Therefore, various problems arising from the non-uniformed temperature rise rate and temperature distribution in the vicinity of the lead terminals, e.g., a solder bridge wherein adjacent lead terminals are connected through solder and are electrically conducted, can be prevented, thereby resulting in an increase of solder operation precision.

Furthermore, the present invention uses a plurality of beams for radiating different lead terminal arrays of an electronic component, thereby greatly reducing the soldering time.

Furthermore, in the present invention soldering operation and electronic conveying/mounting operation are performed simultaneously, thereby simplifying the operation.

Furthermore, since in the present invention soldering is performed by using a high energy beam, physical contact of an electronic component with a soldering apparatus during soldering can be prevented, thereby reducing a positional error in mounting.

DISCLOSURE OF INVENTION

In an electronic component soldering method of the present invention as a first embodiment, an electronic component is mounted on a predetermined position on a circuit board in accordance with a predetermined positioning information, the electronic component has a polygonal main body and lead terminal arrays on a plurality of sides of the main body, and a plurality of high energy beams are scanned on predetermined positions of the lead terminal arrays of the electronic component, thereby soldering the lead terminal arrays to a lead wiring pattern formed on the circuit board. The method is characterized in that the lead terminal arrays are grouped in a plurality of terminal groups, and the high energy beams two-dimensionally, simultaneously radiate the plurality of lead terminal groups a plurality of times, each high energy beam having an emission power insufficient for complete soldering by a single radiation, thereby performing soldering.

An electronic component soldering apparatus of the present invention is characterized by comprising an electronic component holding means for holding an electronic component by the tip thereof, a rotational driving means for rotating the electronic component holding means so that a position of the electronic component in a rotating direction is aligned on a predetermined position on a circuit board, a holding section driving means for three-dimensionally moving the electronic component holding means, a beam emitting means arranged above the circuit board, for emitting a high energy beam onto a surface of the circuit board, a beam emission angle changing means for changing an emission angle of the high energy beam emitted from the beam emitting means to the circuit board, and a beam scanning control means for controlling the beam emission angle changing means so that the high energy beam scans a predetermined lead terminal array of the electronic component mounted on the circuit board in a predetermined of times.

BEST MODE FOR CARRYING OUT THE INVENTION

A preferred embodiment of the present invention will be described with reference to the accompanying drawings.

Figure 1:
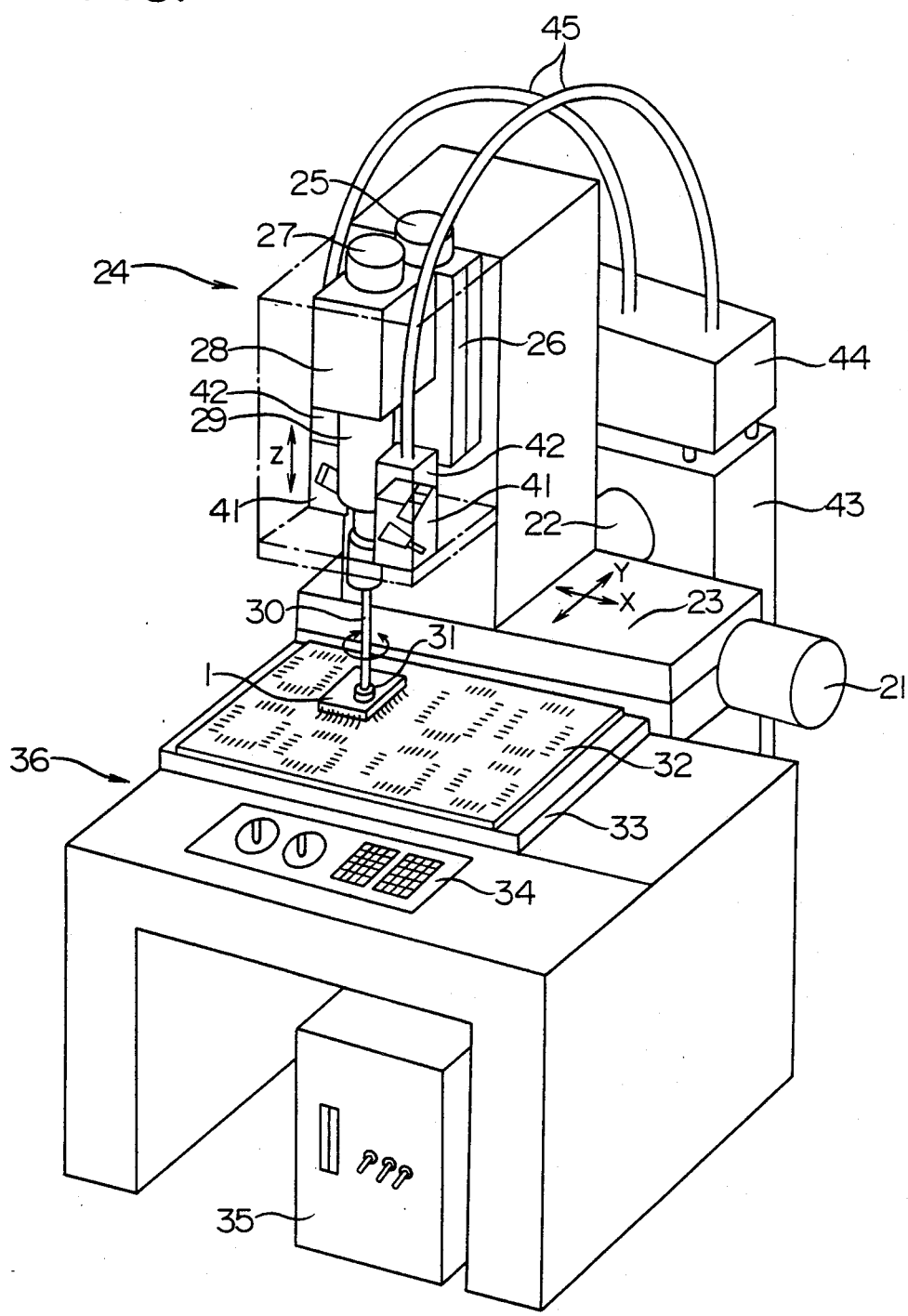
FIG. 1 is a perspective view showing an outer appearance of a mounting apparatus according to an embodiment of the present invention.

FIG. 1 shows a mounting apparatus used in an embodiment of the present invention. A mount head section 24 is mounted on an X-Y table 23 driven by X-axis driving means 21 and Y-axis driving means 22. A Z table 26 connected to a z-axis driving means 25 is provided in the mount head section 24. A rotational driving means 27, a chucking head 28, a connecting shaft 29, a thread cylindrical chucking tool shaft 30, and a chucking terminal 31 for chucking an electronic component are provided in one body on one side of the Z table 26. A pair of laser emitting means 41 for soldering electronic components and a pair of laser optical units 42 for guiding a laser beam through inside optical fibers are provided on the connecting shaft 29.

The chucking terminal 31 can move three-dimensionally and can rotate by means of the X-Y table 23, the Z table 26, and the rotational driving means 27. An apparatus mounting section 36 having a bench 33 for placing a circuit board 32 thereon, a control panel 34, an electronic equipment section 35 having a control mechanism, and the like are arranged on the front of the X Y table 23.

A laser beam oscillator 43, a laser optical unit 44, and optical fibers 45 are arranged behind the X-Y table 23. The laser oscillator 43 oscillates, e.g., a YAG laser beam. The laser optical unit 44 guides the laser beam emitted from the oscillator 43 into the optical fibers 45. The optical fibers 45 optically connect the optical units 42 and 44.

The laser oscillator 43 is provided with a Q switch for intermittently oscillating the laser beam. The laser oscillator 43 can therefore oscillate the laser beam at a desired timing.

Figure 2:
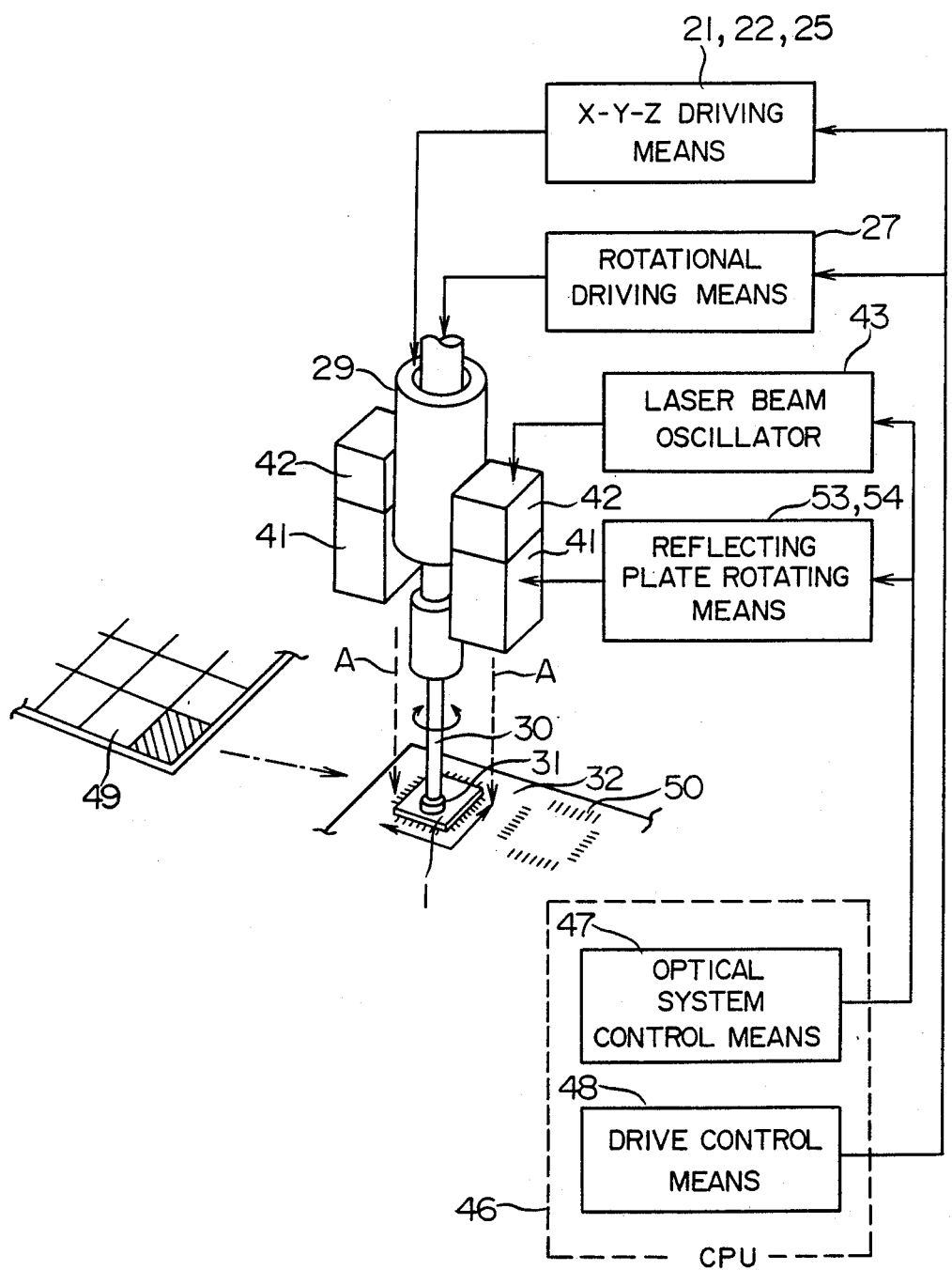
FIG. 2 shows an arrangement of a chucking head section shown in FIG. 1.

The mount head section 24 will be described in more detail with reference to FIGS. 2 and 3. The cylindrical connecting shaft 29 is provided on the upper end of the thread cylindrical chucking tool shaft 30 having the chucking terminal 31 on its lower end. The chucking tool shaft 30 serves as the rotating shaft to rotate the electronic component 1. The pair of laser optical units 42 and the pair of laser emitting means 41 are provided on the cylindrical connecting shaft 29. Each pair diagonally sandwiches the central axis of the connecting shaft 29.

Figure 3:
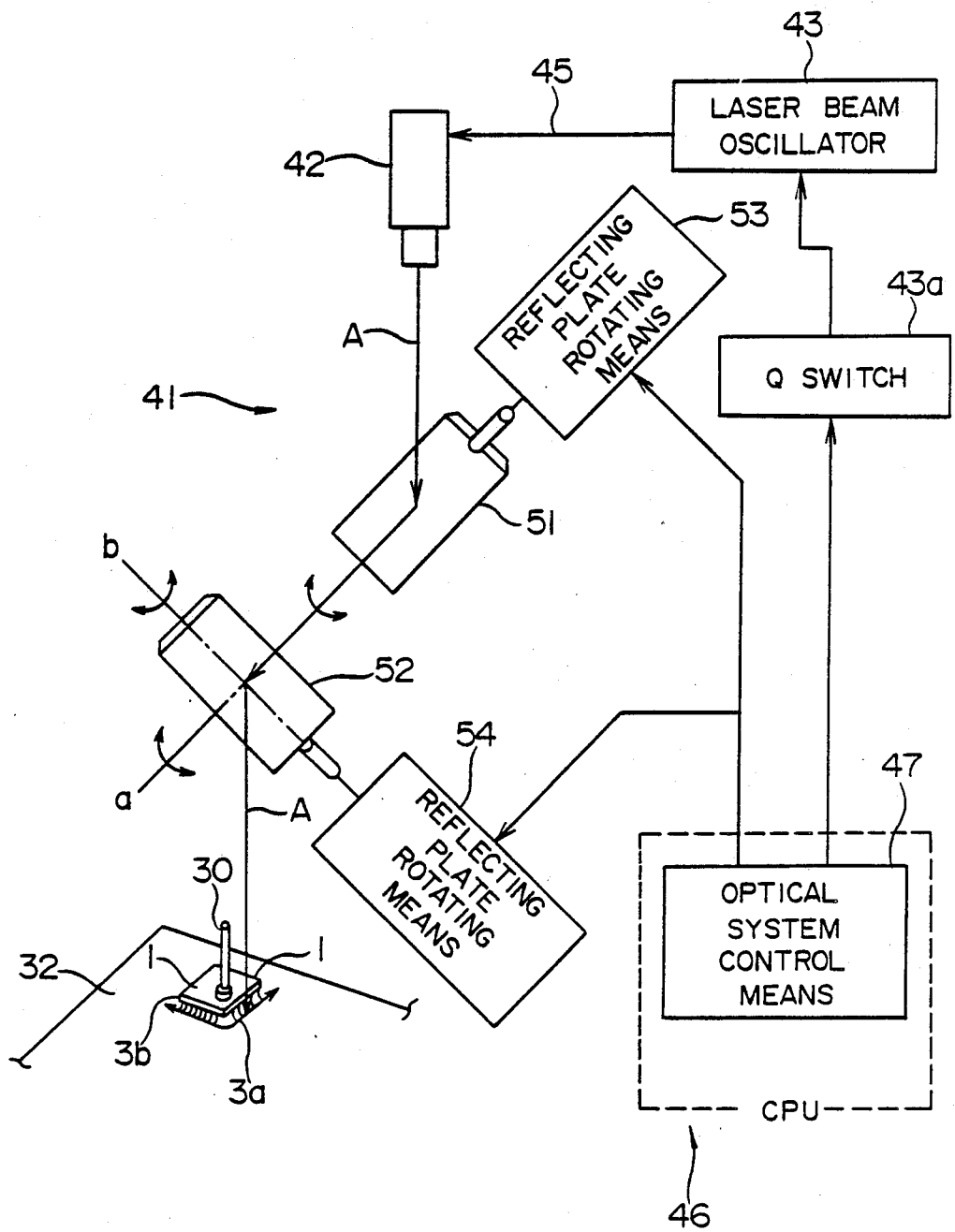
FIG. 3 shows the optical system of the laser emitting means and an operation for driving the optical system.

First and second laser reflecting plates 51 and 52 are provided in the laser emitting means 41, as shown in FIG. 3. The first laser reflecting plate 51 rotates about an axis of rotation "a" to scan the emitted laser beam A on the circuit board 32. The second laser reflecting plate 52 perpendicularly opposes the first reflecting plate 51 and rotates about an axis of rotation "b" perpendicular to the axis of rotation "a".

The laser reflecting plates 51 and 52 are respectively connected to reflecting plate rotating means 53 and 54 controlled by an optical system control means 47 of a CPU 46 of the mounting apparatus. The laser reflecting plates 51 and 52 are rotated by the reflecting plate rotating means 53 and 54 to two-dimensionally scan the laser beam on the circuit board.

A soldering method using the soldering apparatus having the above described arrangement will be described.

The electronic component 1 previously stored in a chip tray 49 is chucked by the chucking terminal 31. A drive control means 48 drives the X-, Y , and Z-axis drive means 21, 22, and 25 in accordance with an electronic component positioning information previously stored in the CPU 46 of the mounting apparatus to convey the electronic component 1 to a predetermined position on the circuit board 32. The electronic component 1 is then aligned in the X-Y direction. The chucking tool shaft 30 is rotated by the rotational driving means 27 in a similar manner to align the electronic component 1 in its rotating direction. The Z table 26 is driven to move the chucking terminal 31 downward, thereby mounting the electronic component 1 at the predetermined position on the circuit board 32.

When the mounting operation is completed in this manner, the laser oscillator 43 is driven to solder the lead terminal array 3 of the electronic component 1 and a lead wiring pattern 50 formed on the circuit board 32.

Figure 4:
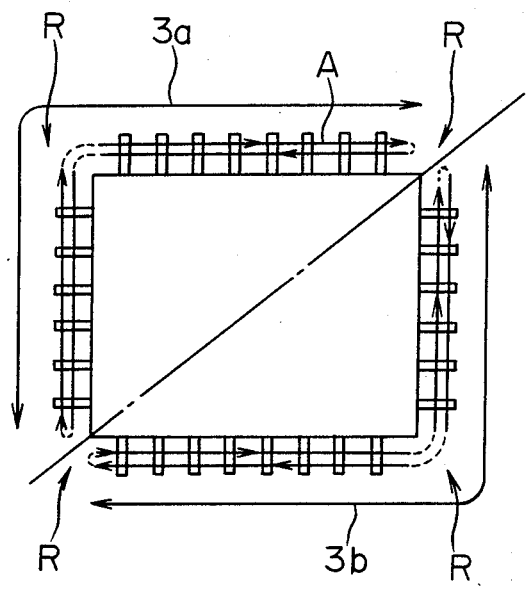
FIG. 4 shows an example of scanning of an electronic component with a laser beam.
Figure 5:
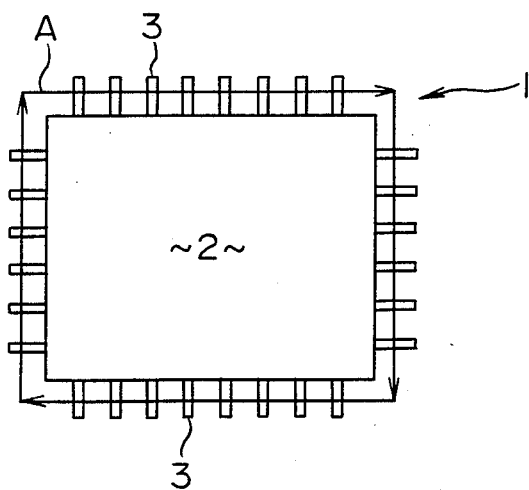
FIG. 5 is a plan view of an electronic component.

In this case, the laser beam A is scanned in the following manner. While the optical systems of the two laser emitting means 41 diagonally opposing each other through the axis of rotation of the electronic component 1, as shown in FIG. 4, the laser beam A separately and simultaneously scans lead terminal arrays 3a and 3b on adjacent two sides of the electronic component 1 a plurality of times in an L-shaped manner. This scanning control is performed two dimensionally by the laser reflecting plates 51 and 52 and the reflecting plate rotating means 53 and 54 for rotating the plates 51 and 52. In this embodiment, the plates 51 and 52 perform scanning in the Y-X direction, respectively, on the circuit board 32. Since the laser beam is scanned two-dimensionally, it can effectively scan an electronic component which has a polygonal shape in order to increase the electronic component mounting density. In other words, rotating alignment operation of a circuit board mounting an electronic component can be simplified.

Laser radiation with the laser beam A is stopped at portions of the electronic component 1 not corresponding to the lead terminal arrays 3, i.e., four corners R of the electronic component 1, thereby preventing burning of the circuit board caused by the laser beam. The laser beam A is enabled/disabled by a Q switch 43a provided to the laser oscillator 43 for oscillating, e.g., a YAG laser beam.

In this manner, when a plurality of high energy beams such as laser beams are used and the lead terminal arrays on the respective sides of the electronic component are irradiated with the different high energy beams a plurality of times, the temperature rise rate in the vicinity of the lead terminals can be easily kept inform, and poor soldering such as a solder bridge caused by a local temperature rise is eliminated, resulting in high-precision soldering. Since a plurality of beams radiate different lead terminal arrays simultaneously, the soldering time is greatly reduced.

In this embodiment, the laser beam is used as the high energy beam. However, the present invention is not limited to this. Any high energy beam other than the laser beam, e.g., a high energy infrared or ultraviolet ray, that can be used for non-contact soldering, can be employed.

As described above, according to the present invention, the temperature rise rate in solder portions are made uniform, and high-precision soldering without erroneous soldering can be performed within a short period of time. Since the soldering operation and the electronic component conveying/mounting operation can be performed simultaneously, the entire operation can be simplified. Since soldering is performed using a high energy beam, a physical contact between the electronic component and the soldering apparatus during soldering is prevented, and erroneous mounting is eliminated, resulting in high-precision soldering.

I claim:

1. A method for soldering lead terminals of an electronic component to a lead wiring pattern formed on a circuit board, the electronic component including a main body having a plurality of sides, the lead terminals being disposed along at least one of the plurality of sides, the method comprising the steps of:

mounting the electronic component on a predetermined position on the circuit board in accordance with predetermined positioning information to substantially juxtapose the lead terminals of the electronic component with the lead wiring pattern of the circuit board; and scanning high energy beams, a plurality of times, along a path traversing the lead terminals of the electronic component and the lead wiring pattern of the circuit board to solder the lead terminals to the lead wiring pattern by directing a high energy beam to one or more reflecting plates and rotating the reflecting plates to scan the beam a plurality of times along the path, the step of scanning high energy beams being effectuated simultaneously using a plurality of high energy beams to scan a plurality of groups of said lead terminals.

2. The method according to claim 1, wherein the step of scanning of said high energy beams is stopped between adjacent sides of said electronic component.

3. The method according to claim 1, wherein the high energy beams are laser beams.

* * * * *